(12) United States Patent
Sakamoto et al.

(10) Patent No.: US 10,388,708 B2
(45) Date of Patent: Aug. 20, 2019

(54) DISPLAY DEVICE

(71) Applicant: Japan Display Inc., Tokyo (JP)

(72) Inventors: Shigeru Sakamoto, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 48 days.

(21) Appl. No.: 15/848,088

(22) Filed: Dec. 20, 2017

(65) Prior Publication Data

US 2018/0204892 A1 Jul. 19, 2018

(30) Foreign Application Priority Data

Jan. 16, 2017 (JP) .................. 2017-004911

(51) Int. Cl.
*H01L 27/32* (2006.01)
*H01L 51/52* (2006.01)

(52) U.S. Cl.
CPC ...... *H01L 27/3246* (2013.01); *H01L 51/5203* (2013.01); *H01L 51/5262* (2013.01); *H01L 27/3211* (2013.01)

(58) Field of Classification Search
CPC ............. H01L 51/5203; H01L 27/3211; H01L 27/3246; H01L 51/5262
See application file for complete search history.

(56) References Cited

U.S. PATENT DOCUMENTS

| | | | | |
|---|---|---|---|---|
| 9,754,971 B2 * | 9/2017 | Yamazaki | ........... | H01L 27/1225 |
| 2002/0158568 A1 | 10/2002 | Satake | | |
| 2016/0190504 A1 * | 6/2016 | Koshihara | ........... | H01L 51/0023 257/72 |
| 2018/0090546 A1 * | 3/2018 | Hashimoto | ......... | H01L 27/3211 |

FOREIGN PATENT DOCUMENTS

JP 2002-324662 A 11/2002

* cited by examiner

*Primary Examiner* — Muhammad N Edun
(74) *Attorney, Agent, or Firm* — Michael Best & Friedrich LLP

(57) ABSTRACT

A display device includes a plurality of pixel electrodes; a bank having a plurality of openings respectively exposing a part of top surfaces of the plurality of pixel electrodes, a light emitting layer provided on the top surfaces of the plurality of pixel electrodes; and a common electrode covering the bank and the light emitting layer. Where an optical path of light emitted from any light emitting point in the light emitting layer and reflected by a corresponding pixel electrode, among the plurality of pixel electrodes, to return to the light emitting point is a first optical path, and an optical path of light emitted from the light emitting point and reflected by the corresponding pixel electrode to reach the bank is a second optical path, the second optical path has a length that is an integral multiple of a length of the first optical path.

14 Claims, 8 Drawing Sheets

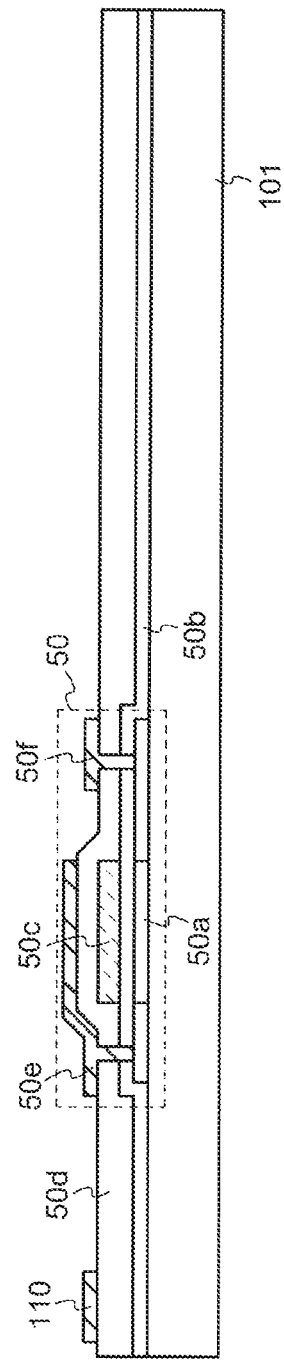

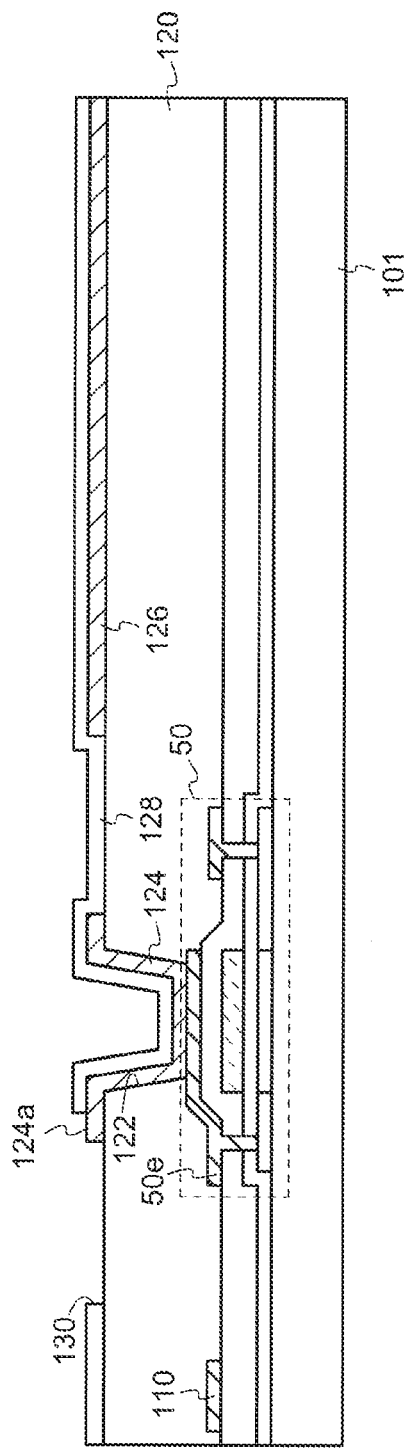

DISPLAY DEVICE

CROSS REFERENCE TO RELATED APPLICATIONS

This application is based on and claims the benefit of priority from the prior Japanese Patent Application No. 2017-004911, filed on Jan. 16, 2017, the entire contents of which are incorporated herein by reference.

FIELD

The present invention relates to a display device including a plurality of pixels, and specifically, to a display device including a light emitting element in each of the pixels.

BACKGROUND

Conventionally, as a display device usable for a display of a mobile terminal, a TV or the like, an organic EL (electroluminescence) display device including an organic EL element is known. An organic EL display device has advantages of emitting bright light, having superb viewing angle characteristics, and the like, and thus rapid development thereof is desired to provide a display device replacing a liquid crystal display device.

Usually, an organic EL display device includes a plurality of pixels each including a light emitting element (specifically, organic EL element). The pixels each include a pixel electrode, and the pixel electrode is used to form a light emitting element. In general, an insulating film referred to as a bank (or a rib) is located on the pixel electrodes. The bank has a plurality of openings respectively corresponding to the plurality of pixel electrodes, and a part of a top surface of each pixel electrode is exposed in the corresponding opening. The organic EL display device having such a structure is disclosed in, for example, Japanese Laid-Open Patent Publication No. 2002-324662.

SUMMARY

A display device in an embodiment according to the present invention includes a plurality of pixel electrodes provided out of contact with each other, on an insulating substrate; a bank covering an end of each of the plurality of pixel electrodes, the bank having a plurality of openings respectively exposing top surfaces of the plurality of pixel electrodes, an organic layer provided on the top surfaces of the plurality of pixel electrodes, the organic layer including a light emitting layer; and a common electrode covering the bank and the organic layer. Where an optical path of light emitted from any light emitting point in the light emitting layer and reflected by a corresponding pixel electrode, among the plurality of pixel electrodes, to return to the light emitting point is a first optical path, and an optical path of light emitted from the light emitting point and reflected by the corresponding pixel electrode to reach the bank is a second optical path, the second optical path has a length that is an integral multiple of a length of the first optical path.

A display device in an embodiment according to the present invention includes a plurality of pixel electrodes provided out of contact with each other, on an insulating substrate; a bank covering an end of each of the plurality of pixel electrodes, the bank having a plurality of openings respectively exposing top surfaces of the plurality of pixel electrodes, an organic layer provided on the top surfaces of the plurality of pixel electrodes, the organic layer including a light emitting layer; a common electrode covering the bank and the organic layer; a first sealing film provided on the common electrode; and a second sealing film provided on the first sealing film. An angle made by an inclining surface acting as an inner wall of each of the plurality of openings and the top surface of a corresponding pixel electrode among the plurality of pixel electrodes is 55±2 degrees (preferably, 55±1 degrees) or 60±2 degrees (preferably, 60±1 degrees), and the first sealing film and the second sealing film have a refractive index difference of 0.2 or less (preferably, 0.1 or less).

BRIEF EXPLANATION OF DRAWINGS

FIG. 5A is a cross-sectional view showing a method for producing a sub pixel of the organic EL display device in embodiment 1;

FIG. 5B is a cross-sectional view showing the method for producing the sub pixel of the organic EL display device in embodiment 1;

DESCRIPTION OF EMBODIMENTS

Figure 1:
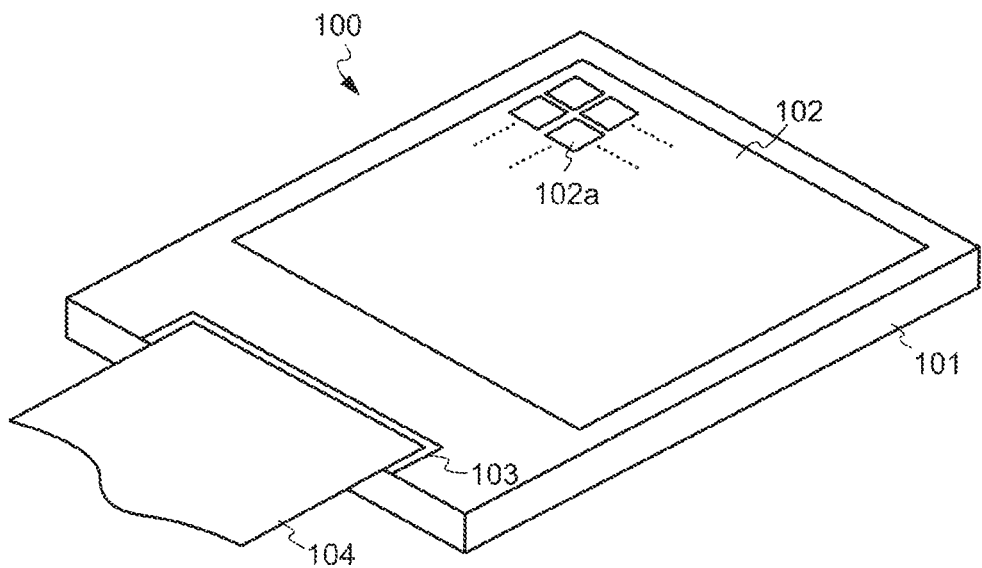
FIG. 1 is a perspective view schematically showing a structure of an organic EL display device in embodiment 1.

Usually, an organic EL display device uses optical interference of a multi-layer film to broaden the range of colors to be reproduced. This technology is to match the peak wavelength of light and the length of the optical of the light to each other for each color of light to be emitted, and thus to use the resonance effect to improve the color purity of the light. Namely, for using this technology, how to control the length of the optical path of the light emitted from the organic EL element is an important factor.

In the organic EL display device described in Japanese Laid-Open Patent Publication No. 2002-324662, the light emitted from the organic EL display device travels along in either one of roughly two optical paths before being visually recognized by a viewer. In a first optical path, the light is not reflected by a bank before being visually recognized by the viewer. For example, the light is visually recognized by the viewer directly from the light emitting point, or is reflected by a pixel electrode in a vertical direction before being visually recognized by the viewer. In a second optical path, the light is reflected by a part of the bank (specifically, by an inclining surface of the bank) before being visually recognized by the viewer. For example, the light advancing obliquely from the light emitting point is reflected by the inclining surface of the bank and is output upward in the vertical direction.

Since there are two different optical paths as described above, there may be a problem that light components of different types of optical interference are mixed together to decrease the color purity of the light to be emitted. For example, in the case of the EL display device described in Japanese Laid-Open Patent Publication No. 2002-324662, there may be a problem that as seen in a plan view, the colors of the emitted light appear to be different in a region at an end the pixel and the vicinity thereof (region overlapping the inclining surface of the bank) from in the other region (region not overlapping the inclining surface of the bank).

In light of the above-described problem, one object of the present invention is to provide a display device providing an improved color purity.

Hereinafter, embodiments of the present invention will be described with reference to the drawings and the like. The present invention may be carried out in various forms without departing from the gist thereof, and is not to be construed as being limited to any of the following embodiments.

In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the specification and the claims, an expression that a component is "on" other component encompasses a case where such a component is in contact with the other component and also a case where such a component is above or below the other component, namely, a case where still another component is provided between such a component and the other component, unless otherwise specified.

In this specification and the claims, the terms "up", "down", "above", "below" and the like represent a positional relationship with respect to a face of a substrate on which light emitting elements are provided (hereinafter, this face will be referred to simply as a "surface"). For example, in this specification, a direction away from the surface of the substrate is defined as "upward", and a direction toward the surface of the substrate is defined as "downward".

Embodiment 1

<Structure of the Organic EL Display Device>

FIG. 1 is a perspective view schematically showing a structure of an organic EL display device 100 in embodiment 1. The organic EL (electroluminescence) display device 100 in this embodiment includes a substrate 101, and also includes a display portion 102 including a plurality of pixels 102a, a terminal portion 103 supplying an external signal to the display portion 102, and a flexible printed circuit 104 transmitting an external signal to the terminal portion 103. The display portion 102, the terminal portion 103, and the flexible printed circuit 104 are provided on the substrate 101.

The display portion 102 is a portion that displays an image. The pixels 102a located in the display portion 102 each include an organic EL element 60 (FIG. 3) as a light emitting element. Namely, the assembly of the plurality of pixels 102a acts as the display portion 102. The pixels 102a each include a thin film transistor 50 (FIG. 3) described below as a driving element. In this embodiment, the thin film transistor 50 included in each pixel 102a is controlled to control light emission of the organic EL element 60 included in each pixel 102a.

The terminal portion 103 includes a line group including lines connected to the display portion 102, and acts as a terminal supplying an external signal. The external signal is transmitted from the flexible printed circuit 104 connected with the terminal portion 103. The terminal portion 103 and the flexible printed circuit 104 may be connected with each other by a known method using an anisotropic conductive film.

The flexible printed circuit 104 is a circuit board usable to transmit or receive a signal to or from an external circuit (not shown). The flexible printed circuit 104 includes a flexible resin substrate and a plurality of lines provided thereon, and is bonded to the terminal portion 103 with an anisotropic conductive film or the like.

In this embodiment, various signals are input to the display portion 102 from the external circuit (not shown). Nonetheless, although not shown, a scanning line driving circuit supplying a scanning signal to a scanning line (gate line) and/or a video signal driving circuit supplying a video signal to a video signal line (data line) may be formed on the substrate 101 by use of the thin film transistor 50. Although not shown, an IC chip acting as a driving circuit outputting such a scanning signal and/or such a video signal may be located on the substrate 101 or the flexible printed circuit 104.

Now, a structure of the pixel 102a of the organic EL display device 100 in this embodiment will be described. The pixel 102a shown in FIG. 1 actually includes three sub pixels respectively corresponding to three primary colors of RGB. Specifically, in this embodiment, one pixel 102a includes a sub pixel 102Ra corresponding to red, a sub pixel 102Ga corresponding to green, and a sub pixel 102Ba corresponding to blue. In this embodiment, the sub pixel 102Ra, the sub pixel 102Ga and the sub pixel 102Ba have the same structure. Therefore, the sub pixel 102Ra will be described below, and the descriptions of the sub pixel 102Ga and the sub pixel 102Ba will be omitted.

Figure 2:
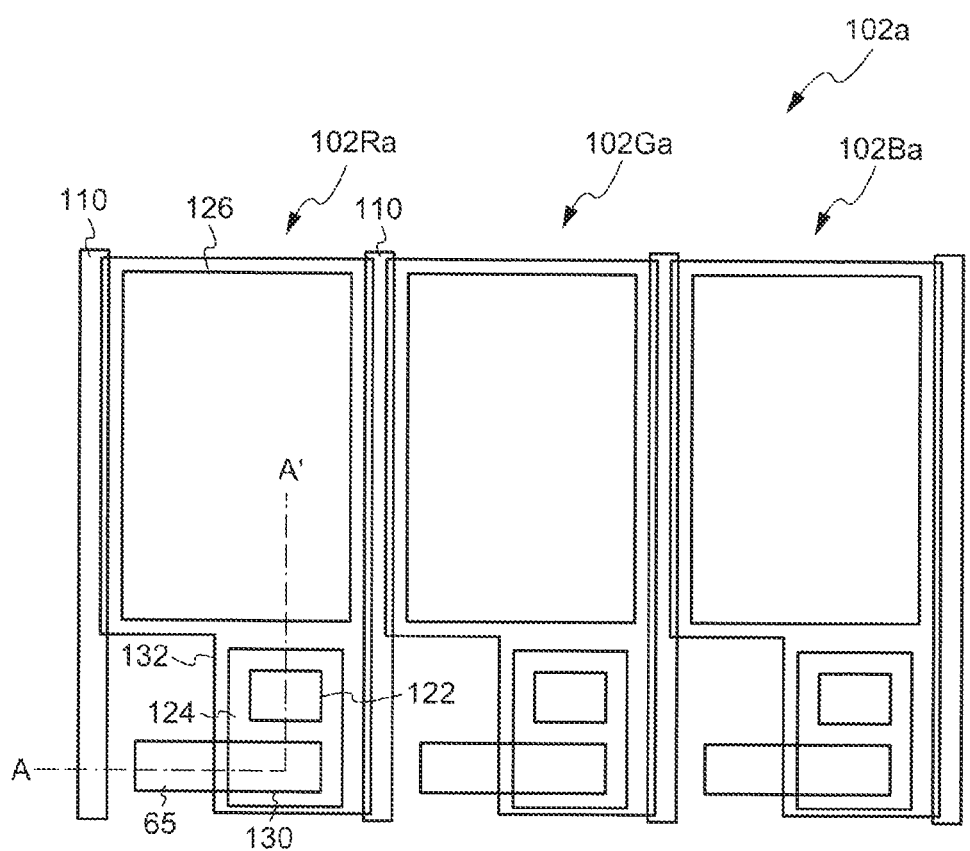
FIG. 2 is a plan view showing a structure of a pixel of the organic EL display device in embodiment 1.
Figure 3:
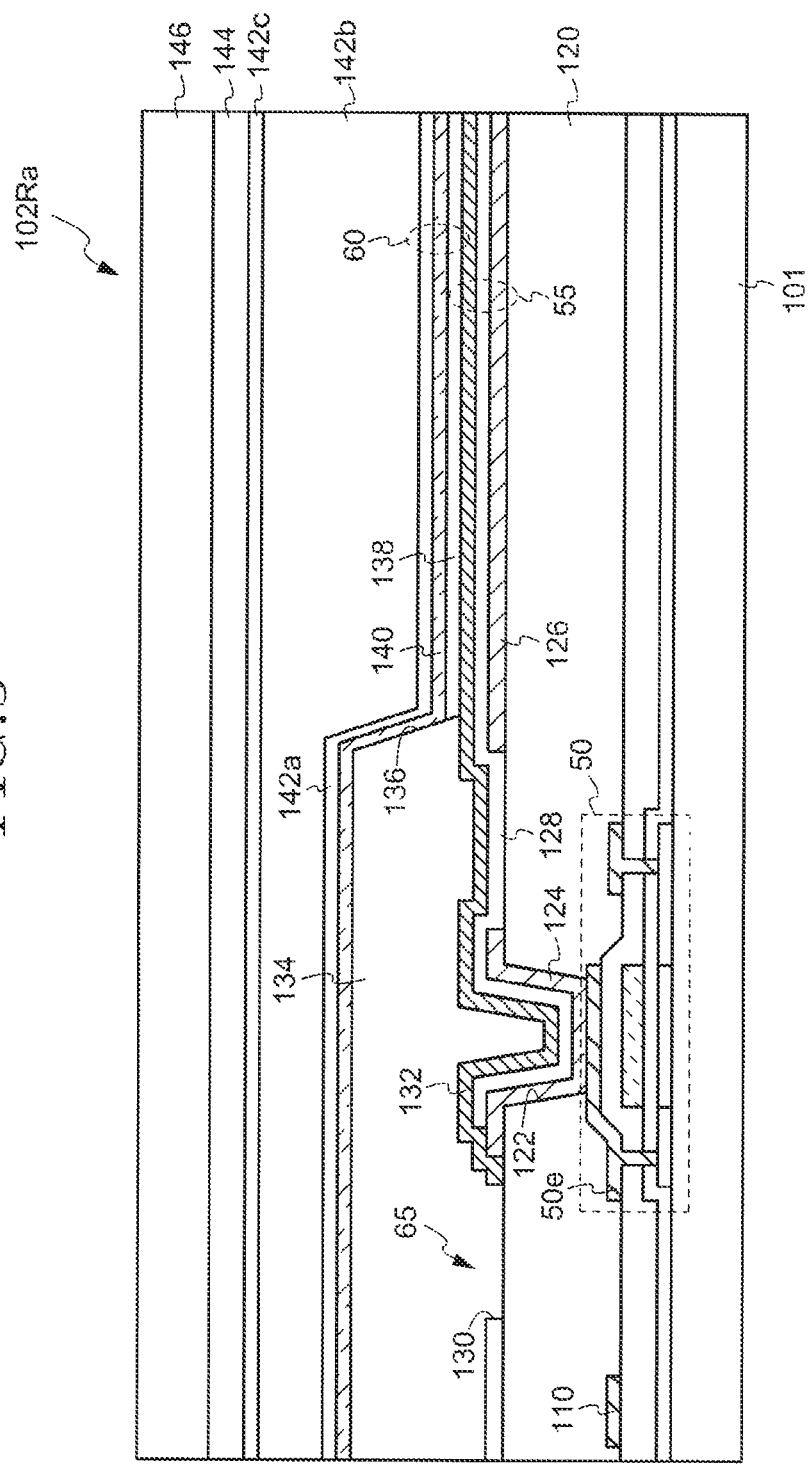
FIG. 3 is a cross-sectional view showing a structure of a sub pixel of the organic EL display device in embodiment 1.

FIG. 2 is a plan view of showing a structure of the pixel 102a of the organic EL display device 100 in embodiment 1. FIG. 3 is a cross-sectional view showing a structure of the sub pixel 102Ra of the organic EL display device 100 in embodiment 1. The cross-sectional view of the sub pixel 102Ra in FIG. 3 is taken along one-dot chain line A-A' in FIG. 2.

As shown in FIG. 3, the thin film transistor 50 is provided on the substrate 101. The substrate 101 may be a glass substrate or a resin substrate formed of a resin material such as a polyimide resin or the like. The organic EL display device 100 in this embodiment is of a type in which light is output upward (opposite side from the substrate 101 as seen from the organic EL element 60). Therefore, the substrate 101 may be light-blocking.

The thin film transistor 50 is a so-called top gate-type thin film transistor. The thin film transistor 50 is not limited to being of this type, and any type of thin film transistor may be provided. The thin film transistor 50 shown in FIG. 3 acts as a driving transistor supplying an electric current to the organic EL element 60. In this embodiment, the thin film transistor 50 is an N-channel transistor. Therefore, the organic EL element 60 is connected with a source electrode 50e of the thin film transistor 50.

The structure of the thin film transistor 50 is known, and thus will not be described in detail. Although not shown in FIG. 3, a storage capacitance may be formed in the process of forming the thin film transistor 50. In this case, the storage capacitance may include any two of conductive films included in the thin film transistor 50 and an insulating film provided between the two conductive films. Such a storage capacitance may have any known structure.

The thin film transistor 50 is covered with an organic insulating film 120. The organic insulating film 120 acts as a flattening film flattening the unevenness caused by the formation of the thin film transistor 50. In this embodiment, the organic insulating film 120 may be formed of an insulating film containing a resin material such as an acrylic resin, a polyimide resin or the like.

The organic insulating film 120 has an opening 122 provided therein. The opening 122 is formed by removing a part of the organic insulating film 120. At this point, the opening 122 is formed to expose a part of the source electrode 50e of the thin film transistor 50. As described below, the thin film transistor 50 and a pixel electrode 132 are electrically connected with each other via the opening 122.

The opening 122 formed in the organic insulating film 120 is covered with an oxide conductive film 124. In this embodiment, the oxide conductive film 124 may be formed by patterning a thin film formed of a metal oxide material such as ITO (Indium Tin Oxide) or the like. The oxide conductive film 124 is not limited to being formed of such a material and may be formed of any other oxide conductive film. The oxide conductive film 124 is connected with the source electrode 50e exposed by the opening 122.

A lower electrode 126 of a storage capacitance 55 is provided on a top surface of the organic insulating film 120. The lower electrode 126 is formed of an oxide conductive film that is different from the oxide conductive film 124 but is formed at the same time as the oxide conductive film 124. The lower electrode 126 is provided below the organic EL element 60. As described below, the organic EL element 60 in this embodiment is of a structure that emits light upward. Therefore, a space below the light emitting element 60 may be utilized to form the storage capacitance 55.

Although shown in neither FIG. 2 nor FIG. 3, the oxide conductive films used for forming the oxide conductive film 124 and the lower electrode 126 of the storage capacitance 55 may be used for another use (e.g., as a line). In this case, a metal film may be located on the oxide conductive film used as the line, so that the line resistance is decreased. An oxide conductive film formed of a metal oxide has a line resistance higher than that of a metal film. Therefore, in the case where the oxide conductive film is used as the line, it is preferable that the metal film is provided thereon to decrease the entire line resistance. In this case, the oxide conductive film 124 also acts as a protective film protecting the source electrode 50e of the thin film transistor 50 against etching gas in the step of forming the metal film.

An inorganic insulating film 128 is provided on the organic conductive film 124 and the lower electrode 126. In this embodiment, the inorganic insulating film 128 is formed of a silicon nitride film. The inorganic insulating film 128 is not limited to being formed of silicon nitride, and may be formed of another inorganic insulating film such as a silicon oxide film or the like. The inorganic insulating film 128 has an opening 130 provided therein exposing a part of the organic conductive film 124.

The pixel electrode 132 is provided on the inorganic insulating film 128. The pixel electrode 132 is connected with the oxide conductive film 124 via the opening 130 formed in the inorganic insulating film 128. Namely, the pixel electrode 132 is connected with the thin film transistor 50 via the oxide conductive film 124. The pixel electrode 132 also acts as an upper electrode of the storage capacitance 55, and also as an anode electrode of the organic EL element 60.

The pixel electrode 132 covers a part of the opening 130. Namely, referring to FIG. 2, a region of each opening 130 that is not covered with the pixel electrode 132 acts as a water drawing region 65. The water drawing region 65 plays a role of allowing moisture or the like, generated from the organic insulating film 120 by a heating step after the formation of the organic insulating film 120, to escape outside.

In this embodiment, the pixel electrode 132 is formed of a conductive film having a stack structure including oxide conductive films of ITO or the like and a silver-containing thin film provided between the oxide conductive films. The pixel electrode 132 is not limited to having such a structure. It is desirable that the pixel electrode 132 includes a reflective conductive film to allow light emitted from the organic EL element 60 to be output upward.

In this embodiment, a dielectric film included in the storage capacitance 55 is a silicon nitride film, which has a dielectric constant higher than that of other insulating films. This provides an advantage that a high capacitance is easily provided. In addition, the space below the organic EL element 60 may be effectively utilized to provide the storage capacitance 55. This provides an advantage that the area size occupied by the storage capacitance 55 is easily made large.

The pixel electrode 132 is partially covered with a bank 134 formed of an organic material. Specifically, the bank 134 covers an end of the pixel electrode 132 and has an opening 136 provided therein exposing a part of a top surface of the pixel electrode 132. The part of the top surface of the pixel electrode 132 thus exposed is a substantial light emitting region of the pixel 102a. Namely, the bank 134 has a role of defining the light emitting region of the pixel 102a. The organic material used to form the bank 134 may be a resin material such as a photosensitive acrylic resin, a polyimide resin or the like, but is not limited to any of these.

On a region of the top surface of the pixel electrode 132 that does not overlap the bank 134 (i.e., region in the opening 136), an organic EL layer 138 is provided. In this embodiment, the organic EL layer 138 is formed of an organic EL material by vapor deposition. The organic EL layer 138 includes at least a light emitting layer 138a (FIG. 4), and may also include an electron injection layer, an electron transfer layer, an electron blocking layer, a hole injection layer, a hole transfer layer, and/or a hole blocking layer. The organic EL layer 138 shown in FIG. 3 includes a light emitting layer containing an organic EL material emitting red light.

In this embodiment, light emitting layers that emit light of different colors are provided in different pixels. The light emitting layers are not limited to having such a structure. For example, although not shown, an organic EL layer emitting white light may be provided in the plurality of pixels 102a, and the while light may be colored red, green or blue by use of a color filter provided in each of the pixels 102a. The functional layers such as the electron injection layer, the electron transfer layer, the electron blocking layer, the hole injection layer, the hole transfer layer, and the hole blocking layer may be provided commonly for the plurality of pixels 102a.

A common electrode 140 formed of a conductive film containing an alkaline metal material or an alkaline earth-metal material is provided on the organic EL layer 138. The alkaline metal material or alkaline earth-metal material may be, for example, magnesium (Mg), lithium (Li) or the like.

In this embodiment, an MgAg film formed of an alloy of magnesium and silver is used as the conductive film containing an alkaline earth-metal material. The common electrode 140 acts as a cathode electrode of the organic EL element 60. The common electrode 140 is provided commonly for the plurality of pixels 102a.

In the case where the display device 100 is of a top emission-type, in which the light from the organic EL layer 138 is output upward, namely, is output toward the common electrode 140, the common electrode 140 needs to be light-transmissive. Therefore, in the case of being formed of the above-described conductive film containing an alkaline metal material, the common electrode 140 is made sufficiently thin to transmit light and thus is made light-transmissive. Specifically, the common electrode 140 has a thickness of 10 nm or greater and 30 nm or less to be light-transmissive.

On the common electrode 140, a first sealing film 142a formed of an inorganic material, a second sealing film 142b formed of an organic material and a third sealing film 142c formed of an inorganic material are provided in this order from the lowest film. These sealing films have a role of preventing entrance of the moisture or the like from outside and thus preventing deterioration of the organic EL layer 138 and the common electrode 140. In the following description, in the case where the first sealing film 142a, the second sealing film 142b and the third sealing film 142c do not need to be distinguished from each other, these sealing films may be collectively referred to as a "sealing film 142".

In this embodiment, the first sealing film 142a and the third sealing film 142c are each formed of a silicon nitride film. The first sealing film 142a and the third sealing film 142c are not limited to being formed of such a material and may each be formed of a silicon oxide film instead of a silicon nitride film. Namely, the first sealing film 142a and the third sealing film 142c may each be formed of an inorganic insulating film. As the inorganic insulating film, an insulating film containing silicon nitride is especially preferable.

The second sealing film 142b is formed of an organic insulating film of a resin material. In this embodiment, the second sealing film 142b is formed of an organic insulating film of a resin material, so that the unevenness caused by the bank 134 is flattened. The first sealing film 142a has a thickness of about 1 μm and thus is formed on the inclining surface of the bank 134. By contrast, the second sealing film 142b has a thickness of about 10 μm and thus sufficiently fills the opening 136 formed in the bank 134. Thus, the second sealing film 142b is formed of an organic insulating film of a resin material, so that the unevenness at a top surface of the second sealing film 142b is smaller than the unevenness at a top surface of the first sealing film 142a.

It is desirable that the first sealing film 142a and the second sealing film 142b have a refractive index difference of 0.2 or less (preferably, 0.1 or less). In the case where the refractive indexes of the first sealing film 142a and the second sealing film 142b have such a relationship, when light reflected by the inclining surface of the bank 134 to be directed upward advances toward the second sealing film 142b from the first sealing film 142a, the optical path is prevented from being refracted. In this embodiment, the first sealing film 142a is formed of a silicon nitride film. Therefore, the second sealing film 142b is formed of an organic insulating film having substantially the same refractive index as that of the silicon nitride film (i.e., having a refractive index difference of 0.2 or less (preferably, 01. or less) from that of the silicon nitride film). Namely, where the refractive index of the silicon nitride film used as the first sealing film 142a is n, the organic insulating film used as the second sealing film 142b may have a refractive index in the range of n±0.2 (preferably, n±0.1).

On the third sealing film 142c, a cover member 146 is provided with an adhesive layer 144 being located between the cover member 146 and the third sealing film 142c. The adhesive layer 144 may be formed of a known adhesive. The cover member 146 may be a glass substrate or a resin substrate formed of a resin material such as a polyimide resin or the like. Light output from the organic EL element 60 is transmitted through the cover member 146 to be directed toward the viewer. Therefore, the cover member 146 is a light-transmissive substrate. The cover member 146 may be omitted. In this case, the adhesive layer 144 and the cover member 146 may be omitted.

Figure 4:
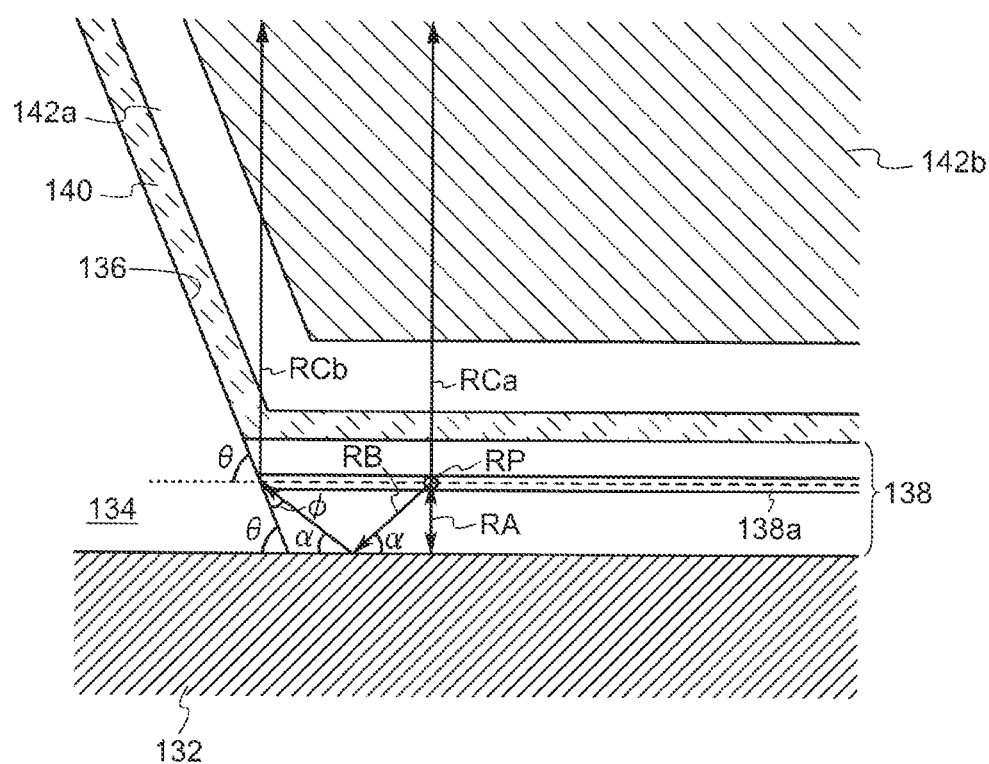
FIG. 4 is a partial enlarged view of the organic EL display device showing a structure of an inclining surface of a bank and the vicinity thereof.

Now, with reference to FIG. 4, control on the length of the optical path of the light output from the organic EL element 60 in the organic EL display device 100 in this embodiment will be described. FIG. 4 is a partial enlarged view of the organic EL display device 100 in embodiment 1, showing the inclining surface of the bank 134 and the vicinity thereof. Specifically, FIG. 4 shows the relationship between an angle made by the inclining surface of the bank 134, which is an inner wall of the opening 136, and the top surface of the pixel electrode 132, and the optical path of the light.

As shown in FIG. 4, in the light emitting layer 138a included in the organic EL layer 138, a hole injected from an anode electrode and an electron injected from a cathode electrode are bonded together at an arbitrary position to emit light. In this specification, the position at which the hole and the electron are bonded together to emit light is referred to as a "light emitting point RP". An optical path of light that is generated at the light emitting point RP, advances vertically downward and is reflected by the top surface of the pixel electrode 132 in the vertical direction (normal direction) to return to the light emitting point RP is referred to as a "first optical path RA". An optical path of light that is generated at the light emitting point RP, advances obliquely downward and is reflected by the top surface of the pixel electrode 132 to reach the bank 134 is referred to as a "second optical path RB".

An angle made by the inclining surface of the bank 134 (i.e., the inner wall of the opening 136) and the top surface of the pixel electrode 132 is θ. An angle made by a part of the second optical path RB that is after the light is reflected by the top surface of the pixel electrode 132, and the top surface of the pixel electrode 132, is α. An angle made by the part of the second optical path RB and the inclining surface of the bank 134 is φ.

In order to match the light interference of the light that has traveled along the first optical path RA and the light interference of the light that has traveled along the second optical path RB to each other, the length of the second optical path RB is made an integral multiple of the length of the first optical path RA. For example, in FIG. 4, when α=30 degrees, the length of the second optical path RB is twice the length of the first optical path RA. In FIG. 4, the relationships of θ=α+φ and θ+φ=90 degrees are realized. Therefore, in order to make the length of the second optical path RB twice the length of the first optical path RA, the bank 134 may be formed such that θ=60±2 degrees (preferably, 60±1 degrees).

In the case where the angle θ made by the inclining surface of the bank 134 (i.e., the inner wall of the opening 136) and the top surface of the pixel electrode 132 is within 60±2 degrees (preferably, 60±1 degrees), the second optical path RB is designed to have a length twice the length of the first optical path RA. As a result, the chromaticity of the light that has travelled along the first optical path RA and then is visually recognized by the viewer and the chromaticity of the light that has travelled along the second optical path RB and then is visually recognized by the viewer are made substantially the same as each other. Thus, the organic EL display device 100 provides an improved color purity.

Herein, the expression "substantially the same" encompasses a case where the chromaticities match each other completely and also a case where the chromaticities are recognized as being the same as, or equivalent to, each other at a degree at which the viewer cannot distinguish the difference. For example, the expression that the chromaticities of the light are substantially the same may be defined to indicate that the peak wavelength difference of the light emission spectra of two light components is within ±5 nm.

It should be noted that the above-described relationship is realized when no significant refraction occurs in an optical path RCb, which is after the light is reflected by the inclining surface of the bank 134 until being transmitted through the cover member 146. In other words, the above-described relationship is realized when the optical path of the light in a region where the inclining surface of the bank 134 and the pixel electrode 132 overlap each other is substantially perpendicular to the top surface of the pixel electrode 132, as seen in a plan view.

For example, in the case of the structure shown in FIG. 4, the optical path RCb, which is after the light is reflected by the inclining surface of the bank 134 until being transmitted through the cover member 146, crosses an interface between the common electrode 140 and the first sealing film 142a and an interface between the first sealing film 142a and the second sealing film 142b. These two interfaces are both along the inclining surface of the bank 134. Therefore, in order to realize the above-described relationship, it is desirable to adjust the refractive indexes of the common electrode 140, the first sealing film 142a and the second sealing film 142b such that the light is refracted to a minimum possible level when crossing these interfaces.

Specifically, it is preferable that the refractive index difference between the common electrode 140 and the first sealing film 142a is 0.2 or less (more preferably, 0.1 or less). Since the common electrode 140 is sufficiently thinner than the first sealing film 142a, the light refraction at the interface between the common electrode 140 and the first sealing film 142a is ignorable. Therefore, it is not indispensable to match the refractive index of the common electrode 140 and the refractive index of the first sealing film 142a to each other.

It is more important that the refractive index difference between the first sealing film 142a and the second sealing film 142b should be 0.2 or less (preferably, 0.1 or less). Since the first sealing film 142a and the second sealing film 142b both have a thickness of a micrometer order, the light refraction at the interface between the first sealing film 142a and the second sealing film 142b is not ignorable. Therefore, it is desirable that the refractive index difference between the first sealing film 142a and the second sealing film 142b is 0.2 or less (preferably, 0.1 or less), so that the light refraction at the interface between the first sealing film 142a and the second sealing film 142b is suppressed to a minimum possible level.

Although not shown in FIG. 4, the optical path RCb crosses an interface between the second sealing film 142b and the third sealing film 142c, an interface between the third sealing film 142c and the adhesive layer 144, and an interface between the adhesive layer 144 and the cover member 146. However, all these interfaces are substantially perpendicular to the optical path RCb. Therefore, the light refraction at these interfaces by the refractive index difference may be ignored with no problem. This is also applicable to an optical path RCa, which is after the light finishes travelling along the first optical path RA until being transmitted through the cover member 146. The optical path RCa is from a region not overlapping the inclining surface of the bank 134, and thus does not cross the interface inclining with respect to the pixel electrode 132. Therefore, the refraction of light in the optical path RCa at these interfaces by the refractive index difference may be ignored with no problem.

As described above, the angle θ made by the inclining surface of the bank 134 and the top surface of the pixel electrode 132 is easily found by a simple expression. The angle of the inclining surface of the bank 134 is designed based on the parameter (θ) thus found, so that the chromaticity of the light that has travelled along the first optical path RA and then is visually recognized by the viewer and the chromaticity of the light that has travelled along the second optical path RB and then is visually recognized by the viewer are made substantially the same as each other.

As described above, in the organic EL display device 100 in this embodiment, the angle θ made by the inclining surface of the bank 134 and the top surface of the pixel electrode 132 is within 60±2 degrees, and the refractive index difference between the first sealing film 142a and the second sealing film 142b is within 0.2 or less. As a result, the color of the light in a region at the center of the pixel and the vicinity thereof and the color of the light in a region at an end of the pixel and the vicinity thereof (specifically, region where the inclining surface of the bank 134 and the pixel electrode 132 overlap each other) may be substantially the same as each other. Thus, the organic EL display device 100 provides an improved color purity.

With reference to FIG. 4, an optical path of the light that is generated at the light emitting point RP and directly reaches the pixel electrode 132 is described as an example. The same concept is applicable to an optical path of the light that is generated at the light emitting point RP and is reflected by the common electrode 140 to reach the pixel electrode 132. Namely, also in the case where the second optical path RB is an optical path of the light that is generated at the light emitting point RP and is reflected by the common electrode 140 and the pixel electrode 132 to reach the bank 134, the second optical path RB may be designed to have a length twice the length of the first optical path RA.

<Method for Producing the Organic EL Display Device>

Now, a method for producing the organic EL display device 100 in this embodiment will be described with reference to FIG. 5A to FIG. 5D. FIG. 5A to FIG. 5D are each a cross-sectional view showing a step of the method for producing the organic EL display device 100 in this embodiment.

First, as shown in FIG. 5A, the thin film transistor 50 and a video signal line 110 are formed on the substrate 101. The thin film transistor 50 may be formed by any known method with no specific limitation. The substrate 101 is a glass substrate in this embodiment, but may be any other insulating substrate.

In the case where the substrate 101 is a flexible substrate formed of a resin material, a resin film of polyimide or the like is formed on a support substrate, and the thin film transistor 50 and the video signal line 110 are formed on the resin film. After the first sealing film 142a, the second sealing film 142*b* and the third sealing film 142*c* shown in FIG. 3 are formed, the support substrate may be peeled off.

In this embodiment, the thin film transistor 50 and the video signal line 110 are formed as follows. An underlying insulating film (not shown) is formed on the substrate 101, and a semiconductor film 50*a* is formed on the underlying insulating film. Next, a gate insulating film 50*b* covering the semiconductor film 50*a* is formed. After the gate insulating film 50*b* is formed, a gate electrode 50*c* is formed on a region of the gate insulating film 50*b* that overlaps the semiconductor film 50*a*. Next, an insulating film 50*d* covering the gate electrode 50*c* is formed. After this, the source electrode 50*e* and a drain electrode 50*f* to be connected with the semiconductor film 50*a* via a contact hole formed in the insulating film 50*d* are formed. At the same time, the video signal line 110 is formed. In this manner, the thin film transistor 50 and the video signal line 110 are formed on the substrate 101.

After the thin film transistor 50 and the video signal line 110 are formed, as shown in FIG. 5B, the organic insulating film 120 is formed. In this embodiment, a positive photosensitive acrylic resin material is used to form the organic insulating film 120. In more detail, an acrylic resin material for forming the organic insulating film 120 is applied to form a film, and the film of the acrylic resin material is patterned by photolithography, by selectively exposing, to light, a region thereof where the opening 122 is to be formed, so that the unnecessary part of the acrylic resin material is removed. In this manner, the organic insulating film 120 having the opening 122 provided therein is formed without etching. As shown in FIG. 5B, the opening 122 is formed to expose a part of the source electrode 50*e* of the thin film transistor 50.

After the opening 122 is formed, the oxide conductive film 124 and the lower electrode 126 of the storage capacitance 55 are formed of a metal oxide material such as ITO or the like to cover the opening 122. The oxide conductive film 124 and the lower electrode 126 are formed by patterning an oxide conductive film of ITO or the like, formed to cover the organic insulating film 120, by photolithography. The oxide conductive film 124 covers the exposed part of the source electrode 50*e* of the thin film transistor 50. The lower electrode 126 is formed in a region where the organic EL element 60 is to be formed in a later step.

In a region that does not need to be light-transmissive, a metal film may be directly formed on a conductive film containing a metal oxide material to form a stack-structured conductive film. Such a stack-structured conductive film decreases the resistance by the metal film and thus is effectively usable as a line or an electrode.

After the oxide conductive film 124 and the lower electrode 126 are formed, the inorganic insulating film 128 is formed. In this embodiment, a silicon nitride film is formed as the inorganic insulating film 128. In the inorganic insulating film 128, an opening 130 is formed to expose a part of the organic insulating film 120 and a part of the oxide conductive film 124 (region 124*a*). The inorganic insulating film 128 acts as a protective film preventing the moisture generated in the organic insulating film 120 from influencing the organic EL element 60 and also acts as a dielectric film included in the storage capacitance 55.

Figure 5C:
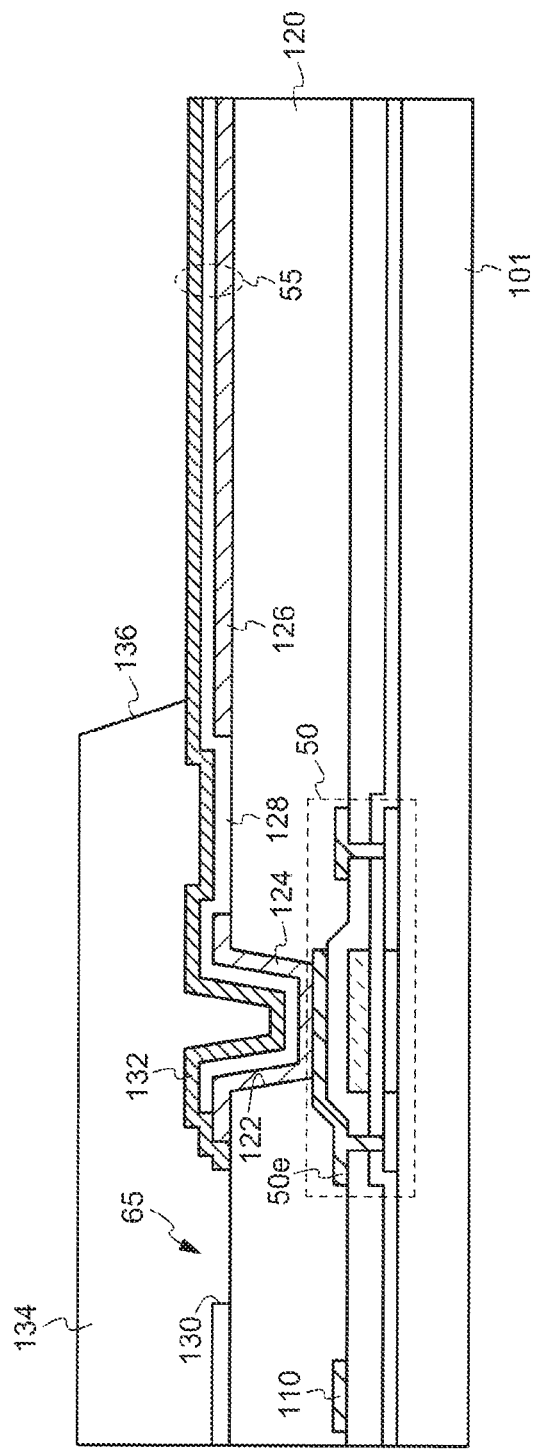
FIG. 5C is a cross-sectional view showing the method for producing the sub pixel of the organic EL display device in embodiment 1.

After the opening 130 is formed in the inorganic insulating film 128, as shown in FIG. 5C, the pixel electrode 132 is formed. The pixel electrode 132 is formed to overlap a part of the opening 130. Therefore, the pixel electrode 132 is connected with the oxide conductive film 124 (specifically, the region 124*a*) in the opening 130. In other words, the pixel electrode 132 is connected with the thin film transistor 50 via the oxide conductive film 124.

In this step, a region of the opening 130 that exposes the organic insulating film 120 acts as the water drawing region 65 shown in FIG. 3. Namely, in the case where a heating process is performed after the opening 130 is formed, the moisture evaporated in the organic insulating film 120 is discharged outside via the water drawing region 65.

As a result of the formation of the pixel electrode 132, the storage capacitance 55 including the lower electrode 126, the inorganic insulating film 128 and the pixel electrode 132 is formed below the organic EL element 60 to be formed in a later step. In this embodiment, although not shown, the storage capacitance 55 is located between the gate electrode 50*c* and the source electrode 50*e* of the thin film transistor 50, which is an N-channel transistor. Namely, the lower electrode 126, which is one of two electrodes of the storage capacitance 55, is connected with the gate electrode 50*c*. The pixel electrode 132, which is the other electrode of the storage capacitance 55, is connected with the source electrode 50*e*.

After the pixel electrode 132 is formed, the bank 134 of a resin material is formed. In this embodiment, a photosensitive acrylic resin material is used to form the bank 134. The bank 134 is formed by patterning to cover an outer periphery of the pixel electrode 132 and to expose the top surface of the pixel electrode 132. The opening 136, which is formed by the patterning, defines a region acting as the light emitting element 60 (light emitting region) on the top surface of the pixel electrode 132.

In this embodiment, after the above-described patterning, the tapering angle of the inner wall of the opening 136 is controlled such that an angle made by the inclining surface of the bank 134, which is the inner wall of the opening 136, and the top surface of the pixel electrode 132 is 60±1 degrees.

Figure 5D:
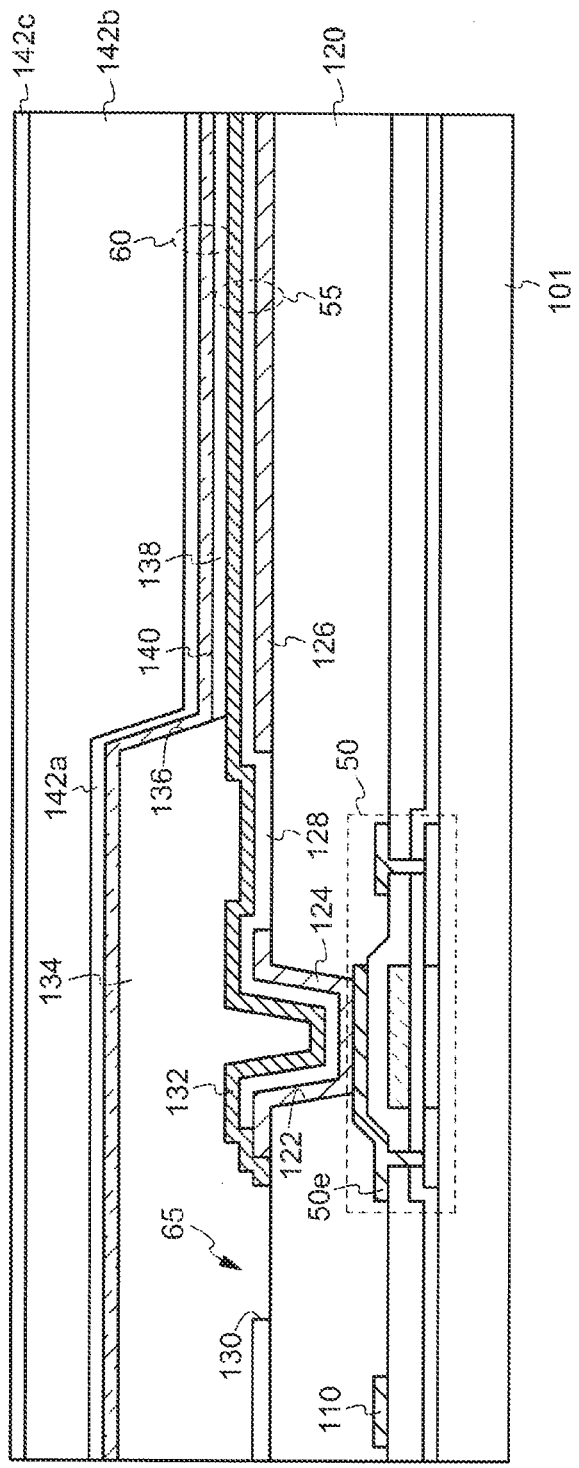
FIG. 5D is a cross-sectional view showing the method for producing the sub pixel of the organic EL display device in embodiment 1.

After the bank 134 acting as the bank is formed as described above, as shown in FIG. 5D, the organic EL layer 138 and the common electrode 140 are formed. In this embodiment, the organic EL layer 138 and the common electrode 140 are formed by vapor deposition pixel by pixel. The organic EL layer 138 and the common electrode 140 are not limited to being formed in this manner. For example, the functional layers other than the light emitting layer, for example, the electron transfer layer or the hole transfer layer, may be commonly provided for a plurality of pixels 102*a*. The organic EL layer 138 usable in this embodiment may be formed of any known material with no specific limitation. In FIG. 5D, the sub pixel 102Ra emitting red light is shown as an example. Therefore, the light emitting layer included in the organic EL layer 138 is formed of a light emitting material emitting red light.

In this embodiment, an MgAg (alloy of magnesium and silver) film is used as the common electrode 140. Like the organic EL layer 138, a conductive film containing an alkaline earth-metal material is vulnerable against moisture or the like. Therefore, it is desirable that the vapor deposition to form the organic EL layer 138 and the vapor deposition to form the common electrode 140 are performed without exposing the materials to the atmosphere. In this case, it is preferable that the vapor deposition to form the organic EL layer 138 and the vapor deposition to form the common electrode 140 are performed continuously while a vacuum state is maintained. The present invention is not limited to this, and it is effective to perform such continuous vapor deposition while an inert atmosphere such as a nitrogen atmosphere or the like is maintained.

At this point, the organic EL element 60 including the pixel electrode 132, the organic EL layer 138 and the common electrode 140 is formed in the opening 136 provided in the bank 134.

Next, the first sealing film 142a formed of a silicon nitride film, the second sealing film 142b formed of a resin material, the third sealing film 142c formed of a silicon nitride film are stacked in this order. In this step, the second sealing film 142b flattens the unevenness caused by the opening 136 formed in the bank 134. Since the second sealing film 142b flattens such unevenness, even if foreign objects such as particles or the like are on the common electrode 140, the possibility that the third sealing film 142c formed on the second sealing film 142b is peeled off by the influence of the foreign objects or that a coverage fault is caused is decreased.

As described above, the second sealing film 142b is formed of a resin material having substantially the same refractive index as that of the first sealing film 142a. Namely, it is desirable to select a resin material of the second sealing film 142b such that the refractive index difference between the first sealing film 142a and the second sealing film 142b is 0.2 or less (preferably, 0.1 or less).

After the state shown in FIG. 5D is obtained, the cover member 146 such as a glass substrate or the like is formed on the substrate 101 with the adhesive layer 144 formed of a resin material being located between the cover member 146 and the substrate 101. In such a process, the organic EL display device 100 shown in FIG. 3 is produced.

Embodiment 2

In embodiment 2, a bank having a tapering angle different from that in embodiment 1 is provided. In this embodiment, differences from the organic EL display device 100 in embodiment 1 will be mainly described, and the same components will bear the same reference signs, and the description thereof may be omitted.

In embodiment 1, the length of the second optical path RB is twice the length of the first optical path RA. In this embodiment, an example in which the length of the second optical path RB is three times the length of the first optical path RA will be described with reference to FIG. 4, which is also used in embodiment 1.

As described above, the first optical path RA, the second optical path RB, the angle $\theta$ made by the inclining surface of the bank 134 and the top surface of the pixel electrode 132, the angle a made by a part of the second optical path RB that is after the light is reflected by the top surface of the pixel electrode 132 and the top surface of the pixel electrode 132, and an angle $\phi$ made by the part of the second optical path RB and the inclining surface of the bank 134 are defined regarding the light emitted from the light emitting point RP.

Referring to FIG. 4, when $\alpha=20$, the length of the second optical path RB is three times the length of the first optical path RA. More specifically, at this point, the source of the light reflected by the inclining surface of the bank 134 and output in the vertical direction, namely, the light emitting point RP, is more distanced from the bank than in the case where the second optical path RB is twice the length of the first optical path RA. In FIG. 4, the relationships of $\theta=\alpha+\phi$ and $\theta+\phi=90$ degrees are realized. Therefore, in order to make the length of the second optical path RB three times the length of the first optical path RA, the bank 134 may be formed such that $\theta=55\pm2$ degrees (preferably, $55\pm1$ degrees).

In the case where the angle $\theta$ made by the inclining surface of the bank 134 (i.e., the inner wall of the opening 136) and the top surface of the pixel electrode 132 is within $55\pm2$ degrees (preferably, $55\pm1$ degrees), the second optical path RB is designed to have a length three times the length of the first optical path RA. As a result, the chromaticity of the light that has travelled along the first optical path RA and then is visually recognized by the viewer and the chromaticity of the light that has travelled along the second optical path RB and then is visually recognized by the viewer are made substantially the same as each other. Thus, an organic EL display device in this embodiment provides an improved color purity.

Embodiment 3

In embodiment 1, the second optical path RB has a length twice the length of the first optical path RA. In embodiment 2, the second optical path RB has a length three times the length of the first optical path RA. The length relationship between the first optical path RA and the second optical path RB is not limited to any of these, and the second optical path RB may have a length four times the length of the first optical path RA. In this embodiment, differences from the organic EL display device 100 in embodiment 1 will be mainly described, and the same components will bear the same reference signs, and the description thereof may be omitted.

Although not shown, when $\alpha=15$ in the relationship among RA, RB, $\alpha$, $\theta$ and $\phi$ in FIG. 4, the length of the second optical path RB is four times the length of the first optical path RA. Therefore, it may be designed such that $\theta=52.5\pm2$ degrees (preferably, $52.5\pm1$ degrees). However, in the case where the length of the second optical path RB is four times the length of the first optical path RA, the color purity may be decreased. Therefore, in actuality, it is preferable that the length of the second optical path RB is twice or three times the length of the first optical path RA.

In this embodiment also, it is desirable that the refractive index difference between the first sealing film 142a and the second sealing film 142b is 0.2 or less (preferably, 0.1 or less), so that the light refraction at the interface between the first sealing film 142a and the second sealing film 142b is suppressed to a minimum possible level.

The above-described embodiments according to the present invention may be optionally combined as long as no contradiction occurs. The display devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in the condition optionally by a person of ordinary skill in the art. Such devices and methods are encompassed in the scope of the present invention as long as including the gist of the present invention.

Even functions and effects that are different from those provided by the above-described embodiments but are obvious from the description of this specification or are easily expectable by a person of ordinary skill in the art are naturally construed as being located by the present invention.

What is claimed is:

1. A display device, comprising:
   a plurality of pixel electrodes provided out of contact with each other, on an insulating substrate;

a bank covering an end of each of the plurality of pixel electrodes, the bank having a plurality of openings respectively exposing top surfaces of the plurality of pixel electrodes;

an organic layer provided on the top surfaces of the plurality of pixel electrodes, the organic layer including a light emitting layer; and a common electrode covering the bank and the organic layer, wherein where an optical path of light emitted from any light emitting point in the light emitting layer and reflected by a corresponding pixel electrode, among the plurality of pixel electrodes, to return to the light emitting point is a first optical path, and an optical path of light emitted from the light emitting point and reflected by the corresponding pixel electrode to reach the bank is a second optical path, the second optical path has a length that is an integral multiple of a length of the first optical path.

2. The display device according to claim 1, wherein the length of the second optical path is twice or three times the length of the first optical path.

3. The display device according to claim 1, wherein an angle made by an inclining surface acting as an inner wall of each of the plurality of openings and the top surface of a corresponding pixel electrode among the plurality of pixel electrodes is 55±2 degrees or 60±2 degrees.

4. The display device according to claim 1, wherein the second optical path includes an optical path of light generated at the light emitting point and directly reaching the corresponding pixel electrode, or an optical path of light generated at the light emitting point and reaching the corresponding pixel electrode after being reflected by the common electrode.

5. The display device according to claim 1, further comprising a first sealing film provided on the common electrode and a second sealing film provided on the first sealing film,
wherein the first sealing film and the second sealing film have a refractive index difference of 0.2 or less.

6. The display device according to claim 5, wherein the first sealing film is an inorganic insulating film, and the second sealing film is an organic insulating film.

7. The display device according to claim 6, wherein the inorganic insulating film contains silicon nitride.

8. The display device according to claim 5, wherein unevenness generated at a top surface of the second sealing film is smaller than unevenness generated at a top surface of the first sealing film.

9. The display device according to claim 1, wherein light that has traveled along the first optical path as seen in a plan view and light that has traveled along the second optical path as seen in a plan view have substantially the same chromaticity as each other.

10. A display device, comprising:
a plurality of pixel electrodes provided out of contact with each other, on an insulating substrate;
a bank covering an end of each of the plurality of pixel electrodes, the bank having a plurality of openings respectively exposing top surfaces of the plurality of pixel electrodes;
an organic layer provided on the top surfaces of the plurality of pixel electrodes, the organic layer including a light emitting layer;
a common electrode covering the bank and the organic layer;
a first sealing film provided on the common electrode; and
a second sealing film provided on the first sealing film, wherein
an angle made by an inclining surface acting as an inner wall of each of the plurality of openings and the top surface of a corresponding pixel electrode among the plurality of pixel electrodes is 55±2 degrees or 60±2 degrees, and the first sealing film and the second sealing film have a refractive index difference of 0.2 or less.

11. The display device according to claim 10, wherein the first sealing film is an inorganic insulating film, and the second sealing film is an organic insulating film.

12. The display device according to claim 11, wherein the inorganic insulating film contains silicon nitride.

13. The display device according to claim 10, wherein unevenness generated at a top surface of the second sealing film is smaller than unevenness generated at a top surface of the first sealing film.

14. The display device according to claim 10, wherein where an optical path of light emitted from any light emitting point in the light emitting layer and reflected by a corresponding pixel electrode, among the plurality of pixel electrodes, to return to the light emitting point is a first optical path, and an optical path of light emitted from the light emitting point and reflected by the corresponding pixel electrode to reach the bank is a second optical path, the light that has traveled along the first optical path as seen in a plan view and the light that has traveled along the second optical path as seen in a plan view have substantially the same chromaticity as each other.

* * * * *